(12) United States Patent
Behr et al.

(10) Patent No.: US 7,840,305 B2
(45) Date of Patent: Nov. 23, 2010

(54) ABRASIVE ARTICLES, CMP MONITORING SYSTEM AND METHOD

(75) Inventors: Andrew H. Behr, Littleton, CO (US); Brian D. Goers, Minneapolis, MN (US); Vincent J. Laraia, Holton, WI (US); Gary M. Palmgren, Lake Elmo, MN (US); Daniel B. Pendergrass, Jr., Mendota Heights, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 0 days.

(21) Appl. No.: 11/427,154

(22) Filed: Jun. 28, 2006

(65) Prior Publication Data

US 2008/0004743 A1  Jan. 3, 2008

(51) Int. Cl.
*G06F 19/00* (2006.01)
*H01L 21/00* (2006.01)
*B24B 49/00* (2006.01)
*B24B 21/18* (2006.01)

(52) U.S. Cl. .................. 700/174; 700/108; 700/164; 700/173; 700/175; 438/5; 451/1; 451/443

(58) Field of Classification Search ........ 700/108–110, 700/121, 164, 169, 171, 173–176, 179; 451/1, 451/5, 6, 7, 443, 444, 446; 438/5, 7, 16; 702/81, 84
See application file for complete search history.

(56) References Cited

U.S. PATENT DOCUMENTS

| | | | |
|---|---|---|---|
| 4,311,489 A | 1/1982 | Kressner | |
| 4,652,275 A | 3/1987 | Bloecher et al. | |
| 4,799,939 A | 1/1989 | Bloecher et al. | |
| 5,343,146 A | 8/1994 | Koch et al. | |
| 5,486,129 A * | 1/1996 | Sandhu et al. | 451/5 |
| 5,550,547 A | 8/1996 | Chan et al. | |
| 5,620,489 A | 4/1997 | Tselesin | |
| 5,682,143 A | 10/1997 | Brady et al. | |
| 5,692,950 A * | 12/1997 | Rutherford et al. | 451/552 |
| 5,833,519 A * | 11/1998 | Moore | 451/56 |
| 5,975,994 A * | 11/1999 | Sandhu et al. | 451/56 |

(Continued)

FOREIGN PATENT DOCUMENTS

CN  1250372  4/2006

(Continued)

*Primary Examiner*—Sean P Shechtman
(74) *Attorney, Agent, or Firm*—James A. Baker; Ann Kulprathipanja

(57) ABSTRACT

The disclosure relates to abrasive articles useful in chemical-mechanical polishing (CMP), the articles including a substrate with opposite major surfaces, an abrasive material overlaying at least a portion of at least one of the major surfaces, and at least one of a radio frequency identification (RFID) tag, a RFID tag reader, or a sensor for providing CMP information to a transmitter positioned near the substrate, the transmitter positioned near the substrate and adapted to wirelessly receive CMP information and wirelessly transmit the CMP information to a remote receiver. The disclosure also relates to a CMP pad conditioner for wirelessly communicating CMP information to a remote receiver, a CMP process monitoring system for wirelessly communicating CMP information to a remote receiver, and a method for conditioning a CMP pad using a CMP process monitoring system for wireless communicating CMP information to a remote receiver.

18 Claims, 5 Drawing Sheets

U.S. PATENT DOCUMENTS

| | | |
|---|---|---|
| 6,123,607 A | 9/2000 | Ravkin et al. |
| 6,123,612 A | 9/2000 | Goers |
| 6,257,953 B1 | 7/2001 | Gitis et al. |
| 6,264,533 B1* | 7/2001 | Kummeth et al. ............... 451/8 |
| 6,319,108 B1* | 11/2001 | Adefris et al. ............... 451/533 |
| 6,330,971 B1 | 12/2001 | Mabry et al. |
| 6,352,466 B1 | 3/2002 | Moore |
| 6,387,289 B1* | 5/2002 | Wright ........................ 216/88 |
| 6,407,669 B1 | 6/2002 | Brown et al. |
| 6,494,765 B2 | 12/2002 | Gitis et al. |
| 6,602,724 B2* | 8/2003 | Redeker et al. ................ 438/5 |
| 6,642,853 B2 | 11/2003 | Hunter |
| 6,722,948 B1 | 4/2004 | Berman |
| 6,752,693 B1* | 6/2004 | Kistler ........................... 451/8 |
| 7,026,941 B1 | 4/2006 | Anderson |
| 7,044,373 B1 | 5/2006 | Garber et al. |
| 7,152,011 B2* | 12/2006 | Benjamin et al. ............ 702/117 |
| 2003/0027424 A1* | 2/2003 | Paik ........................... 438/692 |
| 2004/0113790 A1 | 6/2004 | Hamel et al. |
| 2005/0197044 A1 | 9/2005 | Bolz |
| 2006/0014475 A1* | 1/2006 | Sekiya ........................... 451/5 |

FOREIGN PATENT DOCUMENTS

| | | |
|---|---|---|
| JP | 2004-538169 | 12/2004 |
| JP | 2005-170065 | 6/2005 |
| WO | WO 02/26445 | 4/2002 |

* cited by examiner

ABRASIVE ARTICLES, CMP MONITORING SYSTEM AND METHOD

TECHNICAL FIELD

The present invention relates to abrasive articles useful in chemical-mechanical polishing (CMP). The invention also relates to CMP process monitoring systems, and a CMP pad conditioning method.

BACKGROUND

Silicon wafers used in semiconductor integrated circuit fabrication typically undergo numerous processing steps, including deposition, patterning, and etching steps. In each manufacturing step, it is often necessary or desirable to modify or refine an exposed surface of the wafer in order to prepare the wafer for subsequent fabrication or manufacturing steps. For example, semiconductor wafers having shallow trench isolation (STI) structures require planarization of the dielectric material prior to further processing.

One method of modifying or refining exposed surfaces of wafers employs a continuous process that treats a wafer surface with a polishing slurry containing a plurality of loose abrasive particles dispersed in a liquid. Typically this slurry is applied to a polishing pad and the wafer surface is then ground or moved against the pad in order to remove material from the wafer surface. Generally, the slurry also contains agents that chemically react with the wafer surface. This type of process is commonly referred to as a chemical-mechanical polishing (CMP) process.

Over time, the surface of the polishing pad becomes glazed with entrained by-products of the polishing process, thereby decreasing the removal rate or polishing uniformity for subsequent wafers. In order to maintain the condition of the polishing pad over time, the pad is periodically exposed to a pad conditioner having an industrial diamond surface, and rotated at a specified speed to roughen the polishing pad surface. The CMP pad conditioning process must be carefully monitored in order to maintain a desired wafer surface topography.

SUMMARY OF THE INVENTION

In general, the present invention relates to abrasive articles including a sensor or other means for providing CMP information, and a transmitter adapted to transmit to a remote receiver CMP information useful in monitoring and/or controlling a CMP process. Exemplary abrasive articles include polishing pads (CMP pads) and CMP pad conditioners. Embodiments of the invention also provide a CMP process monitoring system, and a method for conditioning a CMP pad.

In one aspect, embodiments of the present invention provide an abrasive article comprising a substrate having opposite major surfaces, an abrasive material overlaying at least a portion of at least one of the major surfaces, a means for providing CMP information positioned proximate the substrate, and a transmitter positioned proximate the substrate and adapted to transmit the CMP information to a remote receiver. In exemplary embodiments, the means for providing CMP information is selected from one or more of a radio frequency identification (RFID) tag, a RFID tag reader, and a sensor. In certain exemplary embodiments, the means for providing CMP information is a sensor selected from one or more of a thickness sensor, a velocity sensor, an acceleration sensor, a vibration sensor, a force sensor, a pressure sensor, a temperature sensor, a pH sensor, a chemical composition sensor, and a chemical concentration sensor. In some embodiments, the means for providing CMP information provides only non-force CMP information, that is, CMP information not derived from a force or pressure measurement.

In certain embodiments, the abrasive article is a polishing pad, or a CMP pad conditioner. In additional embodiments, the CMP information may include, but is not limited to, CMP pad conditioner data, CMP pad data, and measured CMP process data including one or more of a velocity, acceleration, force, pressure, vibration, thickness, temperature, pH, chemical composition, and chemical concentration measured in a CMP process. In further embodiments, one or both of the CMP pad conditioner data and the CMP pad data may include manufacturing data, composition data, tracking data, quality data, and history data.

In another aspect, embodiments of the present invention provide a CMP pad conditioner comprising a base, an abrasive material overlaying at least a portion of the base, and a means for communicating CMP information positioned proximate the base. In exemplary embodiments, the means for communicating CMP information may communicate the CMP information to a remote receiver using wired electrical/optical cable transmission or wireless transmission such as radio frequency, acoustic, or optical transmission. In certain exemplary embodiments, the means for communicating CMP information includes a sensor that uses wired electrical or optical cable or wireless radio frequency, acoustical, or optical, transmission to communicate CMP information to a remote receiver. In some embodiments, the means for communicating CMP information provides only non-force CMP information, that is, CMP information not derived from a force or pressure measurement. In certain exemplary embodiments, the means for communicating CMP information may be a sensor adapted to wirelessly transmit CMP information to a remote receiver.

In one particular exemplary embodiment, the means for communicating CMP information includes a radio frequency identification (RFID) transponder adapted to wirelessly transmit CMP information to a remote RFID reader/interrogator. The RFID transponder may include one or more of a sensor, an analog to digital converter, a memory, a transmitter, a receiver, a modulator circuit, an antenna, and a power source such as an inductive-capacitive (LC) tank circuit or a battery. The remote receiver may be adapted to receive CMP information from one or more transponders and optionally, one or more RFID tags remote from the receiver.

In another aspect, embodiments of the present invention provide a CMP process monitoring system including at least one abrasive article comprising a substrate having opposite major surfaces and an abrasive material overlaying at least a portion of at least one of the major surfaces. At least one sensor adapted to determine CMP information, and a transmitter adapted to transmit CMP information, are each positioned proximate the at least one abrasive article. In some embodiments, the CMP information is non-force CMP information, that is, CMP information not derived from a force or pressure measurement. In certain exemplary embodiments, the transmitter is adapted to wirelessly transmit CMP information to a remote receiver.

The system includes at least one remote receiver adapted to receive the transmitted CMP information. Certain embodiments include a controller adapted to generating a CMP process control response from the transmitted CMP information. In some exemplary embodiments, the CMP process control response may include altering a CMP pad characteristic, altering a CMP pad conditioner characteristic, altering a CMP slurry characteristic, or altering a CMP process characteristic.

In an additional aspect, embodiments of the invention provide a method for conditioning a CMP pad using a CMP pad conditioner including a base having opposite major sides, an abrasive material overlaying at least a portion of at least one of the major sides, and at least one sensor positioned proximate the base and adapted to determine CMP information when positioned proximate the CMP pad. The method includes positioning a CMP pad proximate at least one sensor of the CMP pad conditioner, thereby providing CMP information to the sensor, and based on the CMP information, generating a pad conditioning control response. In some embodiments, the CMP information is non-force CMP information, that is, CMP information not derived from a force or pressure measurement.

Some embodiments of the present invention may improve the operation of machines used in chemical-mechanical polishing of semiconductor wafers by enabling in situ (i.e. within the CMP machine) monitoring of the thickness and thickness variations in CMP pads used to polish wafers, allowing adjustment of the pad conditioning process to maintain a desired surface shape. In situ monitoring may be concurrent with the polishing operation, or may be intermittent, for example, between polishing steps. In situ monitoring during the CMP process may also prevent damage to the wafer, thereby saving the wafer. Furthermore, close control of the CMP process may allow for tighter specifications to be met and the processing time to be reduced.

In certain embodiments, the CMP process monitoring system may enable stable CMP process operation, thereby maintaining wafer polishing consistency. In other embodiments, the CMP pad conditioning system may enable detection of defective or worn CMP pads or pad conditioners, thereby preventing or reducing damage to wafer surfaces and the resulting expense of wafer processing loss. In additional embodiments, the CMP pad conditioning system may enable detection of changes in the chemical or physical characteristics of the polishing slurry, thereby signaling the need to change or modify the slurry properties.

These and other advantages of the invention are more fully shown and described in one or more embodiments of the invention as set forth in the accompanying drawings and the detailed description of this invention. The above summary is not intended to describe each illustrated embodiment or every implementation of the present invention. The drawings and the detailed description that follow more particularly exemplify certain preferred embodiments using the principles disclosed herein.

DETAILED DESCRIPTION OF THE PRESENTLY PREFERRED EMBODIMENTS

Figure 1A:
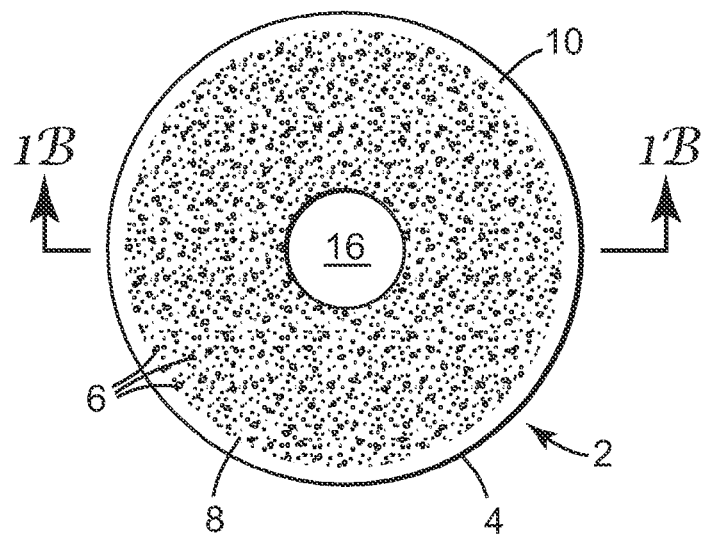
FIGS. 1A-1C show a top view (a) and partial cross-sectional side views (b)-(c) of exemplary abrasive articles according to an embodiment of the invention.

One problem with conventional CMP systems is that consumables, such as the polishing pad (the CMP pad), the CMP pad conditioner, the polishing slurry batches, and the like, have to be replaced on a regular basis to prevent damage to expensive wafers due to worn or contaminated consumables, thereby reducing CMP process productivity. On the other hand, frequent replacement of the consumables at an early stage may significantly add to the operating cost and reduce CMP process throughput. In particular, replacement of CMP consumables in a very advanced stage of use may jeopardize CMP process stability. Moreover, the deterioration of the consumables over time with use renders it difficult to maintain process stability and to reliably predict an optimum time point for consumable replacement. In manufacturing modern integrated circuits, process requirements concerning uniformity of the CMP process are very strict so that the state of the polishing pad has to be maintained as constant as possible over the entire area of each individual wafer processed over a polishing pad use period allowing the processing of as many wafers as possible.

In response to these and other deficiencies of conventional CMP processes, various exemplary embodiments of the invention provide a CMP process monitoring system including CMP pads and/or pad conditioners having a means for providing CMP information useful in monitoring chemical mechanical polishing processes and in practicing a method of conditioning a CMP pad. The embodiments may take on various modifications and alterations without departing from the spirit and scope of the invention. Accordingly, it is to be understood that the invention is not to be limited to the following described embodiments, but is to be controlled by the limitations set forth in the claims and any equivalents thereof. In particular, all numerical values and ranges recited herein are intended to be modified by the term "about," unless stated otherwise.

Various embodiments of the invention will now be described with reference to the Figures. Referring to FIGS. 1A-1C and 2A-2B, there is shown an abrasive article in the form of a CMP pad conditioning disk 2 (i.e. hereafter a "pad conditioner"). Although the abrasive article 2 is described and shown in the Figures as a pad conditioner, it will be understood that the abrasive article may alternatively be a polishing pad for CMP. Suitable abrasive articles 2 are described in U.S. Pat. Nos. 5,620,489 and 6,123,612, the entire disclosure of each patent is incorporated herein by reference. The abrasive article 2 includes a means for providing CMP information, such as sensor 18, which communicates with a transmitter 54 adapted to transmit CMP information to a receiver (not shown in FIGS. 1A-1C or FIGS. 2A-2B) remote from the abrasive article 2.

Figure 1B:
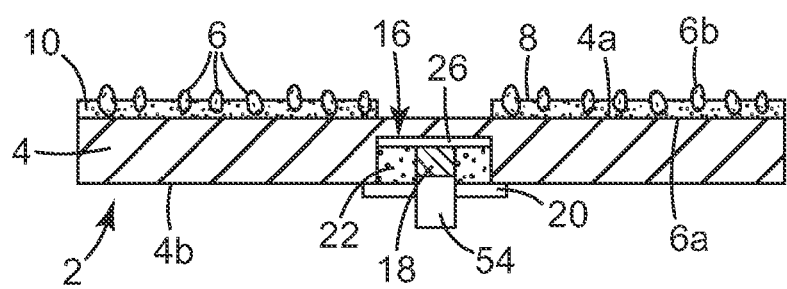
Figure 1C:
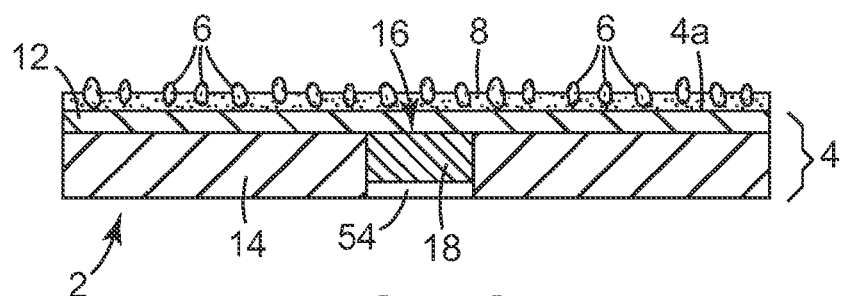

The abrasive article 2 includes a substrate 4 having opposite top 4a and bottom 4b major surfaces, which, in some embodiments, are substantially planar as shown in FIG 1A-1C. In some exemplary embodiments, one (FIGS. 1B and 1C) or both (FIG. 2B) of the major surfaces 4a and 4b may be overlayed with an abrasive material 6, such as a plurality of abrasive particles 6 as illustrated by FIGS. 1A-1C and 2A-2B. In other exemplary embodiments, one or both of the major surfaces 4a and 4b may be a ceramic material or etched silicon, which may be textured or non-textured, overlayed with an abrasive hardcoat such as chemical vapor deposited (CVD) diamond (e.g. diamond-like carbon), plasma vapor deposited (PVD) diamond, and the like.

The substrate 4 may be formed of any suitable material such as, for example, a metal (e.g. stainless steel), a ceramic material (e.g. silica or alumina), a silicon material (e.g. etched silicon), or a polymeric material (e.g. polycarbonate) and combinations thereof. The substrate 4 may be non-textured or textured. The abrasive material 6 may be affixed to one or both sides of a substrate using a matrix material 8 as shown in FIGS. 1A-1C and FIGS. 2A-2b. The abrasive material 6 may include, for example, a plurality of abrasive particles in a matrix material 8 as shown in FIGS. 1A-1C and FIGS. 2A-2b; a slurry of abrasive particles in a fluid carrier (e.g. a CMP polishing slurry); an abrasive coating (e.g. a ceramic or diamond-like carbon coating, and the like); and abrasive structures (e.g. three-dimensional shapes formed from a plurality of abrasive particles and a matrix material 8).

The matrix material 8 may be, for example, a polymeric binder, a metal or a metal alloy, and combinations thereof. In certain embodiments, the matrix material 8 is selected to be a corrosion resistant metal matrix material, which preferably forms a chemical bond as well as a mechanical attachment with the abrasive particles, thereby securely holding the particles in place on the substrate in a wide variety of operating conditions. The substrate 4 may be a separate component to which the abrasive material 6 and the matrix material 8 is affixed as shown in FIGS. 1A-1C and 2A-2B, or the substrate may be formed integrally of matrix material 8, an embodiment which is not illustrated in the Figures.

The size and type of abrasive particles may be selected to achieve the desired characteristics of the abrasive article depending on its intended application. The term "abrasive particles" includes single abrasive particles bonded together by a binder to form an abrasive agglomerate or composite. Abrasive agglomerates are further described in U.S. Pat. No. 4,311,489 to Kressner, U.S. Pat. No. 4,652,275 to Bloecher et al., and U.S. Pat. No. 4,799,939 to Bloecher et al. The abrasive particles may further include a surface treatment or coating, such as a coupling agent or a metal or ceramic coating, or combinations thereof Abrasive particles useful in certain embodiments of the present invention may exhibit an average size (e.g. a volume mean particle diameter as determined using laser diffraction particle size analysis) of at least about 20 micrometers and at most about 1000 micrometers. In some embodiments, the abrasive particles exhibit an average size of at least about 45 micrometers, more preferably at least about 75 micrometers. In other embodiments, the abrasive particles exhibit an average size of at most about 625 micrometers, more preferably at most about 300 micrometers. Occasionally, abrasive particle sizes are reported in terms of "mesh" or "grade," both of which are commonly known abrasive particle sizing terms derived from particle sieving tests using screens of controlled mesh size. In some embodiments, the abrasive particles are selected to pass through screens of about 60 to 500 Tyler mesh.

In certain embodiments, it is preferred that the abrasive particles exhibit a Mohs hardness of at least 8 and, more preferably, at least 9. Suitable abrasive particles include, for example, fused aluminum oxide, ceramic aluminum oxide, heat treated aluminum oxide, silicon carbide, boron carbide, tungsten carbide, alumina zirconia, iron oxide, diamond (natural and synthetic), ceria, cubic boron nitride, garnet, carborundum, boron suboxide, and combinations thereof.

In some embodiments, the plurality of abrasive particles 6 is arranged adjacent to the top substrate surface 4a with a first surrounded portion 6a embedded in a matrix material 8 which serves to affix the particles to the substrate 4 and securely hold each particle in place, and a second exposed portion 6b projecting outwardly from the matrix material 8, thereby forming an abrasive surface. To reduce the likelihood of abrasive particles breaking loose from the substrate 4 in the region where the substrate is formed (for example, cut) to a desired shape, and/or to permit operation of a sensor provided with the abrasive article, a portion of the substrate may be provided free of abrasive particles. This particle free zone may, for example, be formed near the center of the abrasive article, or may extend a certain distance along the entire peripheral edge of the abrasive article, as shown in FIG. 1A. For a typical conditioning disk having a generally circular or annular shape, a particle free zone may be provided both near the disk center and at the outer peripheral edge portion of the substrate.

In accordance with particular embodiments of the invention, the matrix material may include a brazing alloy and a sintered corrosion resistant powder. When heated to a predetermined temperature, the brazing alloy becomes liquid and flows around the abrasive particles. In addition, the brazing alloy reacts with and forms a chemical bond with the abrasive particles. In order to form the chemical bond, the composition of the brazing alloy includes a pre-selected element known to react with the particular abrasive particle, thereby forming the chemical bond. For example, if diamond abrasive particles are used, the brazing alloy may include at least one of the following elements which may react and form a chemical bond with the diamond: chromium, tungsten, cobalt, titanium, zinc, iron, manganese, or silicon. By way of further example, if cubic boron nitride abrasive particles are used, the brazing alloy may include at least one of aluminum, boron, carbon and silicon which may form the chemical bond with the abrasive particles, and if aluminum oxide abrasive particles are used, the brazing alloy may include at least one of aluminum, boron, carbon, and silicon. It will be recognized, however, that the brazing alloy may also contain various additional elements in addition to the element or elements which react with and form the chemical bond with the abrasive particles.

A quantity of corrosion resistant powder may be admixed with the brazing alloy to improve the bonding properties, enhance the strength, improve the corrosion resistant properties, and reduce the cost of the matrix material. The corrosion resistant powder may include metals and metal alloys including stainless steel, titanium, titanium alloys, zirconium, zirconium alloys, nickel, and nickel alloys. More specifically, the nickel alloy may include a nickel alloy including 80% nickel and 20% chrome by weight, for example, Nichrome. Alternatively, the corrosion resistant powder can be formed of ceramics including carbides, such as silicon or tungsten carbide.

In the embodiment shown in FIG. 1C, the abrasive particles 6 and matrix material 8 are affixed to a flexible substrate 12 which is mounted on a rigid carrier 14. The substrate 12 may be formed of any suitable material such as, for example, a polymer film or a metal foil. Preferably, the flexible substrate 12 exhibits low electrically conductivity. The carrier 14 provides rigid support for the substrate 12 and is formed of any suitable material such as, for example, stainless steel having a thickness sufficient to provide adequate structural support. The flexible substrate 12 may be affixed to the carrier 14 with an adhesive such as, for example AF-163-2K aerospace epoxy which is available from 3M Company (St. Paul, Minn.). The substrate 12 may also be attached to the carrier 14 with known mechanical fasteners such as rivets, bolts or screws, or with combinations of adhesives and mechanical fasteners and the like.

In the particular embodiment illustrated by FIG. 1C, the substrate 4 is formed of a thin, flexible metallic or polymeric film 12 overlaying a rigid metal or polymeric carrier 14, for example, a polycarbonate (e.g. LEXAN™, a product of GE Plastics, Pittsfield, Mass.), and affixed to the carrier 14 using, for example, an epoxy adhesive. It will be apparent, however, that both the substrate and carrier may be formed of other materials such as, for example, synthetic polymeric materials, ceramic materials, or other suitable corrosion resistant metals. It will also be apparent that the substrate and carrier can be connected with any suitable fastening technique including adhesive or mechanical fasteners.

The abrasive article 2 includes a means for providing CMP information 18, and a transmitter 54 adapted to transmit the CMP information to a remote receiver (not shown in FIGS. 1A-1C and 2A-2B). The means for providing CMP information 18 may be selected from one or more of a RFID tag, a RFID tag reader, and a sensor. The transmitter is broadly defined as any device which converts CMP information (e.g. provided by the means for providing CMP information, for example, a sensor) into a signal to be received remotely upon wireless or wired transmission to a remote receiver.

As used throughout this disclosure, CMP information may include both stored data and measured CMP process data. Stored data may include, for example, stored CMP pad conditioner and pad data, for example, manufacturing data, composition data, quality data, tracking data, history data, and the like. Manufacturing data may include, but are not limited to, the date, location, conditions, and processing characteristics related to manufacturing of the CMP pad and/or pad CMP pad conditioner. Composition data may include, but are not limited to, the raw materials and compositional ratios of raw materials used in manufacturing the CMP pad and/or pad CMP pad conditioner. Quality data may include, but are not limited to, data used to uniquely identify a particular CMP pad and/or pad conditioner within the manufacturing process used to produce the CMP pad and/or pad conditioner. Tracking data may include, but are not limited to, data used to uniquely identify a particular CMP pad and/or pad conditioner within a CMP process. History data may include, but are not limited to, data used to uniquely identify a particular CMP pad and/or pad conditioner following removal from a CMP process.

Measured CMP process data may include, for example, CMP pad thickness, CMP pad or pad conditioner rotational velocity, CMP pad or conditioner acceleration, force applied to a CMP pad or conditioner, pressure applied to a CMP pad or conditioner, CMP pad or pad conditioner vibration, CMP process temperature and, particularly for the polishing slurry, a pH, chemical composition, concentration, and the like.

In certain embodiments, CMP process data are measured using one or more sensor (i.e. an exemplary means for providing CMP information) 18 and communicated to the transmitter 54 for transmission to a remote receiver (not shown in FIGS. 1A-1C and 2A-2C). In certain exemplary embodiments, sensor 18 communicates measured CMP process data to the transmitter 54, which transmits the measured CMP process data to a remote receiver (not shown in FIGS. 1-2) using wired electrical/optical cable or wireless radio frequency, acoustic, or optical, transmission. In other exemplary embodiments of wireless transmission illustrated by FIG. 4 and discussed further below, sensor 18 and transmitter 54 may be integrated into a RFID transponder 50 (i.e. an exemplary means for communicating CMP information) to wirelessly transmit (and optionally receive) CMP information to (from) a remote receiver (e.g. a RFID reader/interrogator 60). In some embodiments, sensor 18 is provided with the abrasive article 2, and may be integrated with the transmitter as a means for communicating CMP information to a remote receiver, as illustrated in the Figures. In other embodiments, sensor 18 may be a reusable sensor that is attached to a replaceable abrasive article 2.

Suitable sensors are known in the art, and include, for example, a velocity sensor (e.g. a tachometer), an acceleration sensor (e.g. a Micro Electromechanical System, MEMS accelerometer), a vibration sensor (e.g. a seismograph), a force sensor, a pressure sensor, a thickness sensor (e.g. an eddy current thickness sensor), a temperature sensor (e.g. a thermocouple, resistance temperature device, thermistor, and the like), a pH sensor (e.g. a pH sensing electrode) a chemical composition sensor or chemical concentration sensor (e.g. a selective ion electrode), a RFID tag reader, and the like. In one particular embodiment, the CMP pad thickness may be measured by a thickness sensor, for example, an eddy current thickness sensor as described in U.S. Pat. No. 5,343,146, the entire disclosure of which is incorporated herein by reference.

In certain embodiments, the abrasive article 2 is a CMP pad conditioner as shown in FIGS. 1-3. In certain exemplary embodiments, the CMP pad conditioner includes a port 16 positioned proximate at least one of the major surfaces 4a and 4b of substrate 4, preferably near the center of the substrate disk as shown in FIG. 1A. As shown in FIG. 1B, sensor 18 and/or transmitter 54 may be held in place using a mounting flange 20 secured to the pad conditioner, for example, using bolts, screws, or other fasteners (not shown in FIG. 1B). Preferably sensor 18 and/or transmitter 54 is selectively removable from the pad conditioner, permitting reuse of a dedicated (e.g. a reusable) sensor and/or transmitter with replaceable pad conditioners or other replaceable abrasive articles.

The pad conditioner may traverse substantially all of the pad surface that is used to polish wafers. Thus a sensor 18 that is included in the pad conditioner may be used to create a profile of the pad thickness. The most convenient location for a wired sensor 18 is in the center of the conditioner, as shown in FIGS. 1A-1C. Accordingly, in some embodiments, sensor 18 is preferably mounted in the center of the CMP pad conditioner, as shown in FIGS. 1A-1C. However, it is possible to position sensor 18 and/or transmitter 54 in other positions on or within the abrasive article 2, particularly when the abrasive article 2 is a polishing pad, or when sensor 18 or transmitter 54 is wirelessly connected to the remote receiver.

For use with a wire-connected sensor 18 or transmitter 54, a bearing 22 positioned between the pad conditioner and sensor 18 and/or transmitter 54 may allow the pad conditioner (i.e. an abrasive article 2) to rotate without rotating sensor 18 and/or transmitter 54. This could simplify a wired electrical connection to sensor 18 and/or transmitter 54 and eliminate the need for slip rings and brushes, as well as the induced noise in low-level electrical signals. Alternatively, bearing 22 may be replaced by a mounting adhesive, such as an epoxy potting compound, particularly when the electrical connection to sensor 18 and/or transmitter 54 is made wirelessly, for example, using a RFID signal transmission system as described below.

In other exemplary embodiments, the pad conditioner may be made with a port 16 in the conditioner 2 large enough to allow the use of an inductive sensor 18 (e.g. an eddy current thickness sensor) to determine the distance from an abrasive surface of the pad conditioner to a conductive platen (e.g. element 34 in FIGS. 3A-3B) that supports the polishing pad. This distance corresponds to the pad thickness. Preferably, the abrasive surface is formed in the shape of a ring or torus having a generally central non-conductive area large enough not to interfere with the inductive transmitter, as illustrated by FIG. 1A.

In certain embodiments shown in FIG. 1B, the sensor 18 may be held a fixed distance from a pad conditioner major surface 4a, thereby defining a gap 26, which may be precisely set to close tolerance. Holding close tolerances on the placement of the sensor 18 may avoid the need for calibrating the polishing machine each time a new conditioner is used with a dedicated (i.e. reusuable) sensor 18. In other embodiments illustrated by FIG. 1C, when the abrasive article 2 is a pad conditioner comprising a base (i.e. substrate 4) having a metallic carrier 14 overlayed by a thin metallic or non-conductive polymeric substrate 12 bearing a low conductivity abrasive on one major surface 4a, the back of the conditioner may be designed (e.g. machined) to hold the sensor 18 in a port 16 at a predetermined distance from the abrasive surface or the polishing pad.

Figure 2A:
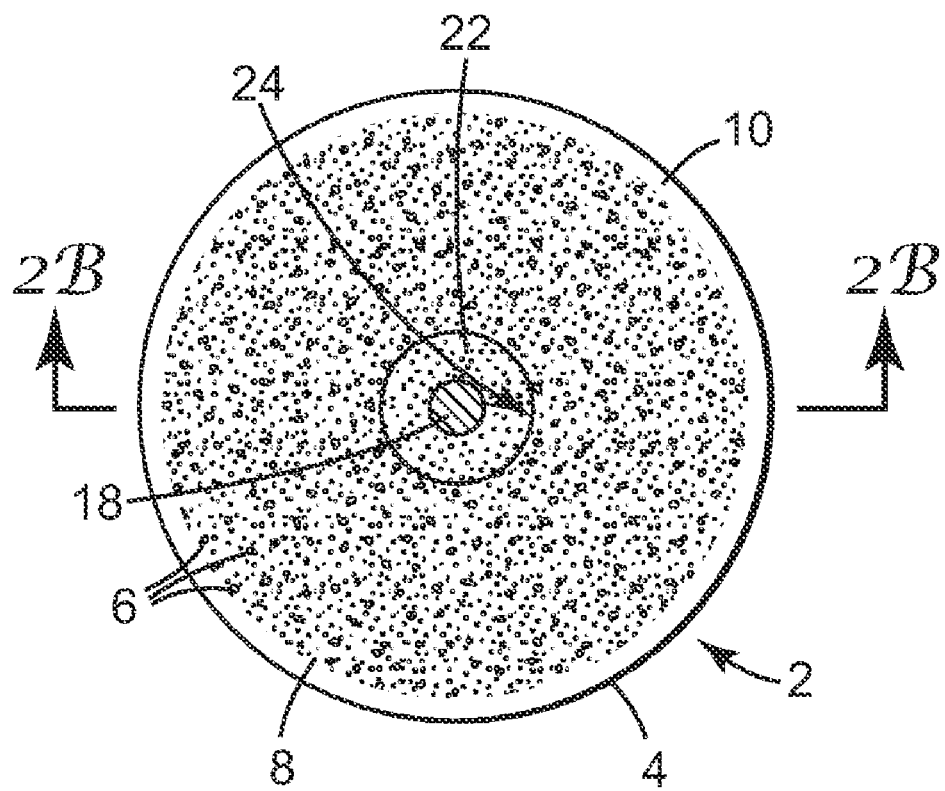
FIG. 2A-2B show a top view (a) and partial cross-sectional side view (b) of an exemplary abrasive article according to another embodiment of the invention.
Figure 2B:
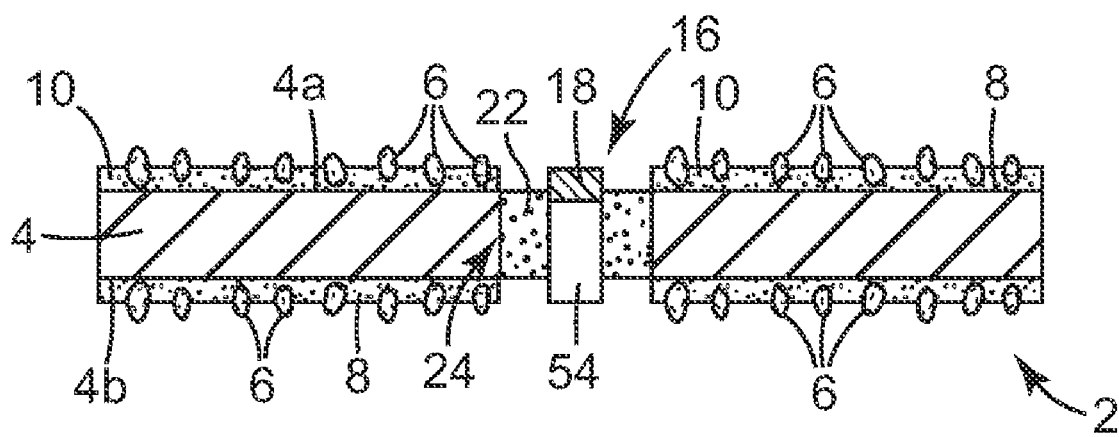

Alternatively, as shown in FIGS. 2A-2B, the port 16 may be an orifice 24 (e.g. a hole) through the metal portions large enough to avoid interference with operation of the sensor 18, as shown in FIGS. 2A-2B. Mounting the sensor 18 within an orifice 24 may be particularly advantageous for use with an eddy current thickness sensor, or if the sensor 18 is a reusable sensor used with a replaceable abrasive article 2. In some embodiments, a portion of orifice 24 surrounding sensor 18 and transmitter 54 may optionally be at least partially filled with a non-conductive material. The exemplary embodiment illustrated in FIGS. 2A-2B is similar to the pad conditioning disks of FIGS. 1A-1C, except the conditioning disk of FIGS. 2A-2B includes a port 16 having a generally centrally located substantially circular orifice 24, and optionally includes a plurality of abrasive particles 6 affixed to both the top 4a and bottom 4b surfaces of the substrate 4.

The embodiment shown in FIGS. 2A-2B also illustrates that transmitter 54, which may be a component of a RFID transponder 50 (e.g. an exemplary means for communicating CMP information) including a sensor 18 (e.g. an exemplary means for providing CMP information) as described below and in FIG. 4, may be positioned within or partially within orifice 24 of port 16. In some embodiments of a CMP pad conditioner abrasive article 2, the transmitter 54 may be completely replaced by a sensor 18, which may be positioned within orifice 24 of port 16, or in other locations on or within the abrasive article 2.

Figure 3A:
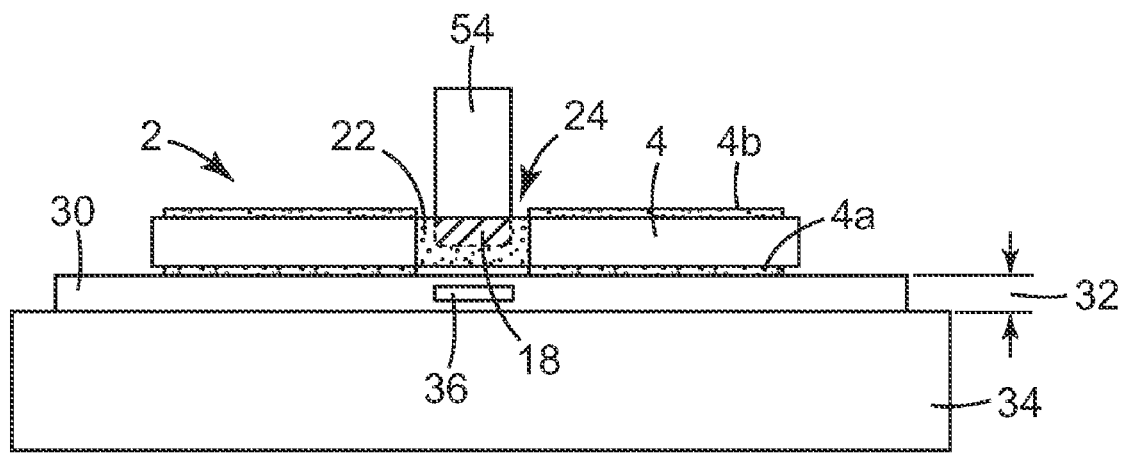
FIG. 3A-3B show partial cross-sectional views of exemplary abrasive articles used in a method for conditioning a CMP pad according to further embodiments of the invention.
Figure 3B:
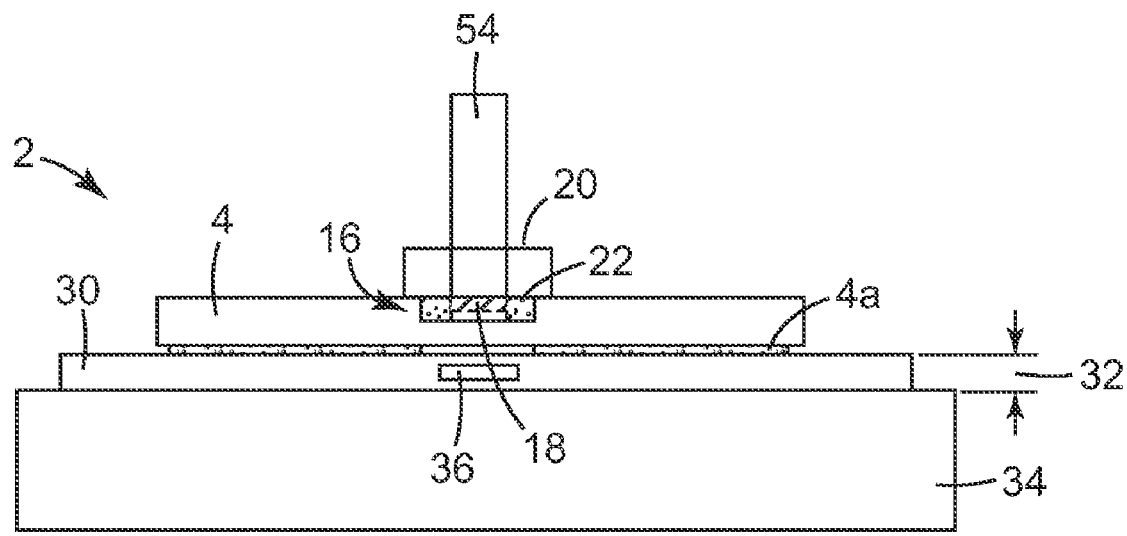

FIGS. 3A-3B illustrate exemplary CMP pad conditioners (abrasive article 2) used in a method for conditioning a CMP pad 30 on a metal platen 34 within a CMP process according to additional embodiments of the invention. In one exemplary method, an abrasive article 2 (e.g. a CMP pad conditioner) is provided, the abrasive article 2 including a substrate base 4 having opposite top 4a and bottom 4b major surfaces, a plurality of abrasive particles overlaying at least a portion of at least one of the major surfaces, and at least one sensor 18 positioned proximate the substrate base 4 and adapted to determine CMP information when positioned proximate a CMP pad 30. Both the bottom surface 4a and top surface 4b are shown overlayed with abrasive particles in FIG. 3A, while only the bottom surface 4a is shown overlayed with abrasive particles in FIG. 3B.

Upon positioning a CMP pad 30 proximate sensor 18, CMP information is provided to transmitter 54 for communication to a remote receiver (not shown in FIGS. 3A-3B). Based on the CMP information, a controller (not shown in FIGS. 3A-3B) generates a pad conditioning control response selected from altering a CMP pad characteristic, altering a CMP pad conditioner characteristic, altering a CMP polishing slurry characteristic, or altering a CMP process characteristic, as described further with reference to FIGS. 4-5 below.

As shown in FIGS. 3A and 3B, the means for providing CMP information, such as sensor 18, and transmitter 54, may be positioned in an orifice 24 (FIG. 3A) or port 16 (FIG. 3B) formed on or within the abrasive article 2. In some embodiments, the mechanism that holds the CMP pad conditioner has electrical connections (not shown in FIGS. 3A-3B) that supply power to the transmitter 54 and allow transmission of electrical signals from the transmitter 54 to an external controller or control unit (not shown in FIGS. 3A-3B), thereby providing CMP information to the external controller or control unit. FIG. 3B illustrates an optional mounting flange 20 secured to the abrasive article 2 and the transmitter 54. An optional bearing 22 is also shown in FIG. 3B, the bearing 22 positioned between the abrasive article 2 and transmitter 54 to allow the conditioner 2 to rotate without rotating the transmitter 54.

Alternatively, bearing 22 may be replaced by a mounting adhesive, such as an epoxy potting compound, particularly if the electrical connection to the sensor 18 and/or transmitter 54 is made wirelessly, for example, using a RFID signal transmission system as described below. In some embodiments, an optional RFID tag 36 capable of being read by a remote RFID tag reader (which may be sensor 18) is included with the CMP pad 30 as shown in FIGS. 3A-3B. Optional RFID tag 36 may be positioned on or within the CMP pad 30. In further embodiments, the transmitter 54 may be a component of a RFID transponder 50 that is capable of reading or interrogating the optional RFID tag 36 as described with respect to FIG. 5 below. In additional CMP pad embodiments, optional RFID tag 36 may include or be substituted with an electrically conductive plate that may be sensed by a remote sensor 18, for example, a remote pad thickness sensor (e.g. an eddy current thickness sensor) provided with the abrasive article 2.

As one non-limiting example, CMP information may include the distance between the sensor 18 and the conductive platen 34, which corresponds to the thickness 32 of the CMP pad 30. As another example, CMP information may include data, such as manufactured CMP pad thickness, encoded in optional RFID tag 36. As yet another example, CMP information may include the distance between the sensor 18 and the electrically conductive plate substituted for optional RFID tag 36, which corresponds to an amount of CMP pad removed due to pad wear relative to the manufactured CMP pad thickness. Other sensors within the CMP polishing machine (not shown in FIGS. 3A-3B) may be used to determine the position of the pad conditioner so that the thickness of the polishing pad 30 may be determined as the CMP abrasive article 2 traverses across the surface of the polishing pad 30.

The method of use may include monitoring of the polishing pad thickness 32 so the pad 30 can be replaced at the end of life or if the thickness variation becomes unacceptable. The method may also include modifying the conditioning cycle to remove more material from thicker portions of the polishing pad 30, and less from thin portions of the polishing pad 30. In one embodiment, the conditioning dwell time of the various portions of the polishing pad 30 is changed so that more abrading or conditioning of the pad 30 is performed on thick areas. In another embodiment, the applied force on the CMP abrasive article 2 is changed so that more force is used in the thick portions of the polishing pad 30 to abrade more of the pad material in the thick areas.

Figure 4:
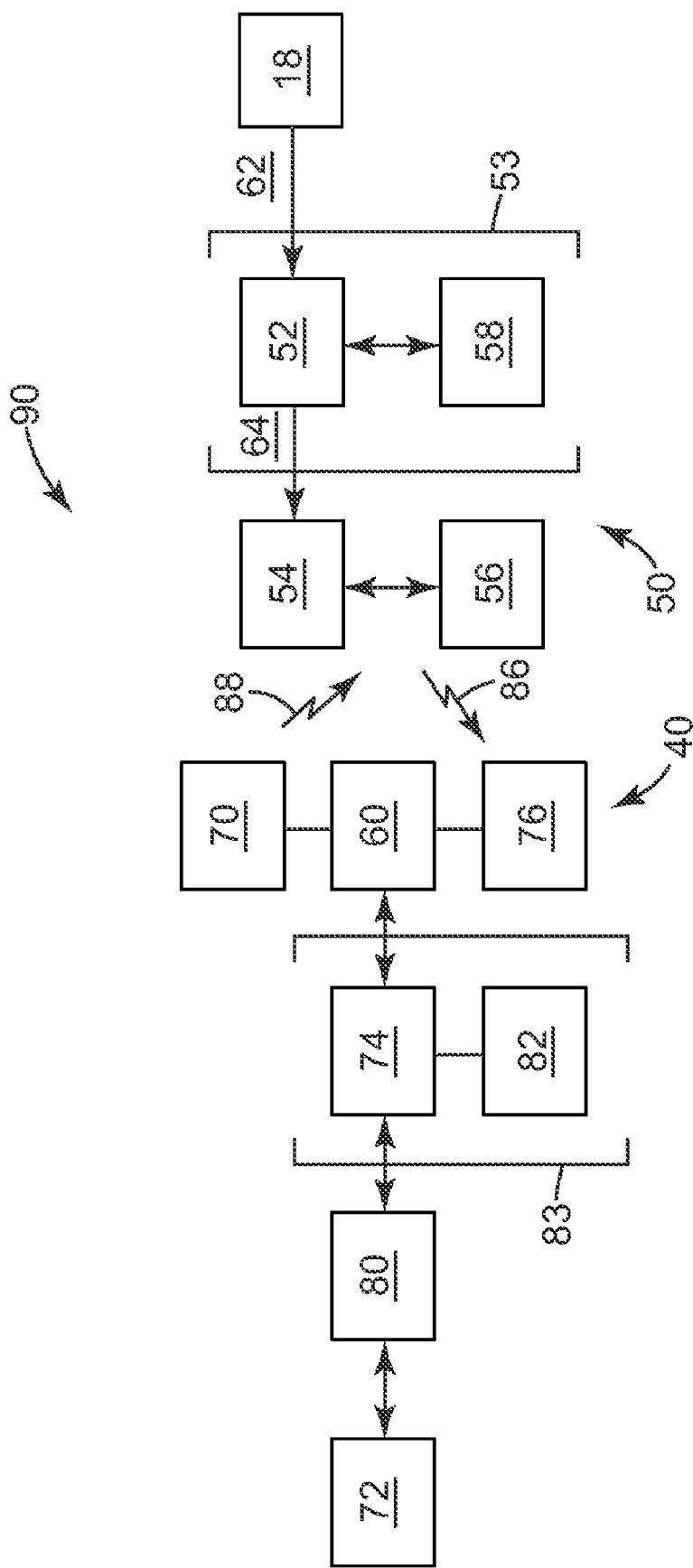
FIG. 4 shows a schematic view of an exemplary CMP process monitoring system according to another embodiment of the invention.

In another exemplary embodiment illustrated in FIG. 4, a CMP process monitoring system 90 is provided for use in monitoring a CMP process 72 in which abrasive articles such as polishing pads and pad conditioners are used. The CMP process monitoring system 90 includes an abrasive article (e.g. a CMP pad or pad conditioner) comprising one or more sensor 18 and a transmitter 54 in communication with the sensor 18 and adapted to transmit CMP information to at least one remote receiver 60.

In some embodiments, CMP information, which may be measured CMP process data from sensor 18, is communicated to remote receiver 60 by transmitter 54, which make-up a transmitter/receiver pair. The transmitter/receiver pair may be of any type known in the art, including, but not limited to radio frequency (RF) devices including amplitude modulated (AM), frequency modulated (FM), microwave, active or passive RFID devices, wireless Bluetooth devices, cellular telephone devices, and the like; optical devices, such as modulated light emitting diode (LED) devices; acoustical devices, and inductively coupled coils. The selection of a particular type of transmitter/receiver pair is within the skill of one familiar with the art of data transmission. In particular, transmitter 54 may transmit using a light source susceptible to modulation such as a light emitting diode (LED), and receiver 60 may receive the modulated light signal using a suitable photodetector.

As shown in FIG. 4, sensor 18 acquires CMP information 62 and provides the CMP information to transmitter 54, optionally first subjecting the CMP information to optional processing elements 53 such as optional signal conditioning element 52. Optional signal processing element 53 may provide amplification, attenuation, analog to digital conversion, digital to analog conversion, modulation, sampling, and the like. Optional processing element 53 may include memory 58 for storing processed or unprocessed CMP information.

Power for the sensor 18, transmitter 54, and optional processing elements 53 may be provided by power source 56, which may comprise a battery, inductive-capacitance (LC) tank circuit, or other source of electrical power. The nature of the power source 56 is not particularly important; however, in certain embodiments, it is preferred that the power source 56 be contained within an abrasive article and not require a direct wired connection from the CMP apparatus to the transmitter 54 and/or sensor 18. In those embodiments where the transmitter 54 is a RFID device, power may be obtained in the usual manner from a RF signal 88 produced by a RFID transceiver 40 as shown in FIG. 4.

The raw or processed CMP information 62 may then be transmitted, for example as wireless signal 86, by transmitter 54 to a remote receiver 60, where it may optionally be further processed by optional remote processing elements 83, for example, optional signal conditioning element 74. Further processing may include demodulation, amplification, attenuation, analog to digital conversion, digital to analog conversion, sampling, and the like. Optional remote processing elements 83 may include optional memory 82 for storing processed or unprocessed received CMP information. Following any conditioning or storage function, the received CMP information may be communicated to remote process controller 80 which controls CMP process 72. Power for the remote receiver 60, the optional remote processing elements 83, and remote process controller 80 may be provided by remote power source 76, which may comprise a power supply, battery, inductive-capacitance (LC) tank circuit, or other source of electrical power.

In some embodiments, the process controller 80 may provide one or more control signal to a transceiver 40 which includes remote receiver 60 and remote transmitter 70. In such embodiments, transmitter 54 should include an appropriate receiver (not shown in FIG. 4) for receiving wireless signal 88 from transceiver 40. Such control signal may be used for a variety of purposes such as adjustment of the sensor 18 and requesting a sample reading. Wired communication pathways may be substituted for the wireless signals 86 and 88 shown in FIG. 4.

For illustrative purposes, an embodiment of the invention that utilizes a wireless RFID transmitter/receiver pair will now be described. Suitable RFID transmitters and receivers are described with respect to RFID systems disclosed in U.S. Pat. Nos. 5,550,547 and 5,682,143, and the entire disclosure of both patents is incorporated herein by reference. In one exemplary embodiment illustrated in FIG. 4, the CMP process monitoring system 90 may include a RFID system including one or more RFID transponders 50, a remote RFID transceiver 40, and, optionally, one or more RFID tags (not shown in FIG. 4).

Figure 5:
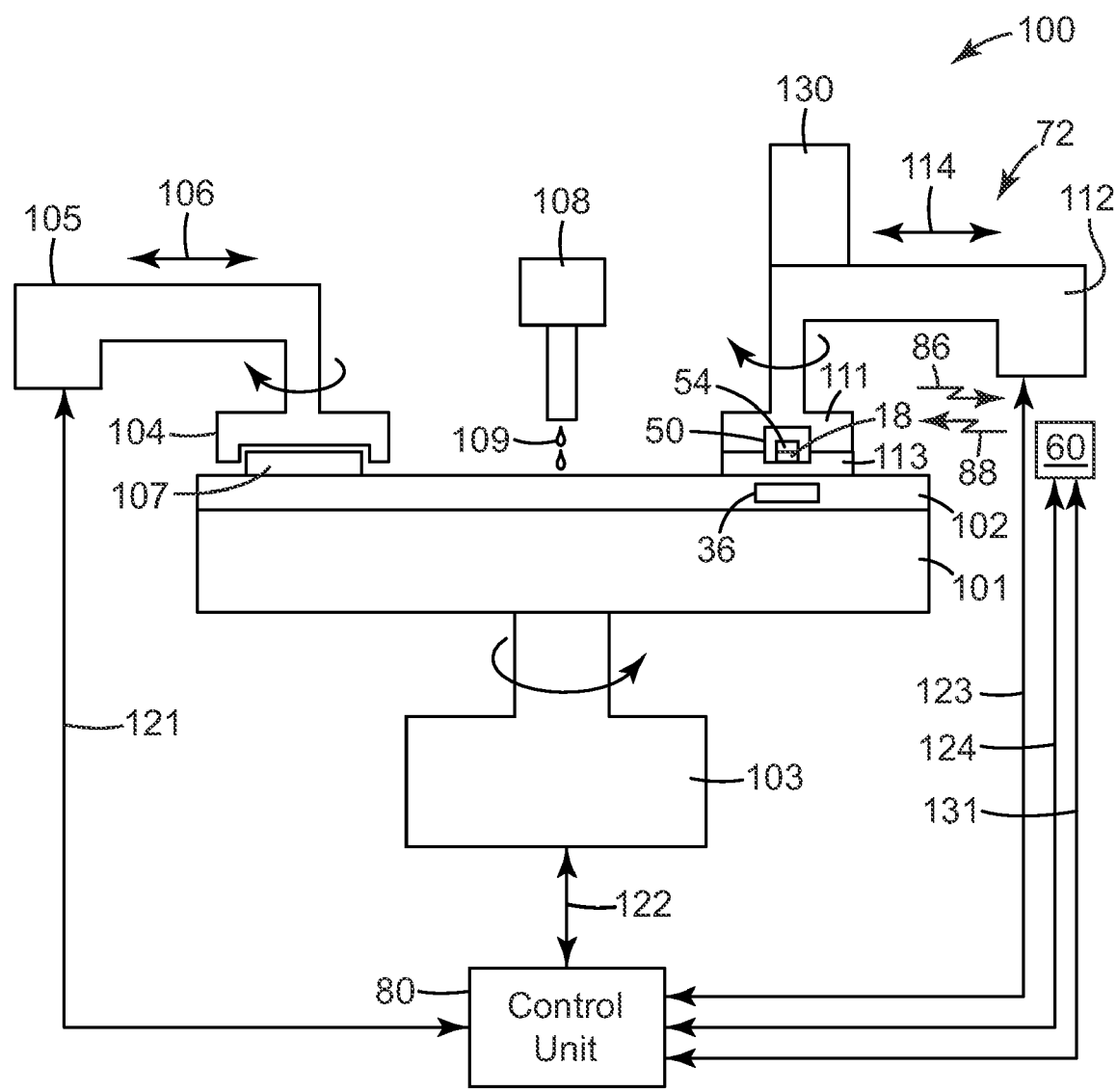
FIG. 5 shows a schematic view of an exemplary CMP process monitoring system according to an additional embodiment of the invention.

As one example illustrated in FIG. 4, the transmitter 54 may be part of a radio frequency identification (RFID) CMP process monitoring system 90, including at least one transponder 50 comprising a sensor 18 and a transmitter 54 for transmitting CMP information, and one or more remote receiver 60 (e.g. a remote RFID tag reader/interrogator) for receiving the transmitted CMP information. The RFID system may optionally include one or more RFID tags 36 encoded with CMP information and provided with a CMP pad, a CMP pad conditioner, a CMP slurry, and the like. FIGS. 3A-3B illustrates one exemplary embodiment having a RFID tag 36, which may include a RFID transponder 50, positioned within a CMP pad. The RFID tag 36 is adapted to communicate with a remote receiver 60 (as shown in FIG. 5). Suitable RFID tags are described in U.S. Pat. No. 6,407,669, the entire disclosure of which is incorporated herein by reference. However, the RFID tags need not include a transmitter 54.

In one particular embodiment, the CMP process monitoring system 90 may include a plurality of radio frequency identification (RFID) transponders, each transponder 50 having a unique digital identification tag and a transmitter 54 coupled thereto, and at least one remote receiver 60 in the form of a RFID transceiver 40 (also known in the art as a RFID interrogator or tag reader) capable of receiving signals from a remote transponder 50, and optionally, transmitting signals to the remote transponder 50. Each transponder 50 may be disposed at a plurality of discrete locations to allow their respective transmitters 54 to transmit CMP information, which may include measured CMP data communicated to the transmitter 54 by one or more remote sensor 18, to remote receiver 60. Each sensor 18 may be associated with a particular abrasive article, allowing CMP process data to be determined at various remote locations in a CMP process. For example, transponders 50 may be provided with and positioned on or within a polishing pad or a CMP pad conditioner.

The remote receiver 60 of the RFID transceiver 40 pulses radio frequency (RF) signals and reads corresponding resonant RF signals from the plurality of transponders 50 representing the unique identification tag of the transponder and the value of the physical variable being measured. One skilled in the art understands that transmitter 54 may transmit the RF signal through a transmitting antenna (not shown) to a receiving antenna (also not shown) coupled to remote receiver 60 of transceiver 40.

While the application of the RFID CMP process monitoring system 90 to determine CMP pad thickness has been used as one example described below, one of ordinary skill in the art will appreciate that various sensor types may be used to measure CMP process data, such as a process temperature, a rotational velocity, an acceleration, a pH, a chemical composition, a chemical concentration, and the like. In addition or alternatively, the sensor may determine CMP information, including CMP pad information, CMP pad conditioner information, and the like.

Each transponder 50 employed in the RFID CMP process monitoring system 90 may include one or more sensor 18 adapted to measure a physical variable, for example pad thickness. A plurality of known in the art sensors, such as thickness sensors, velocity sensors, acceleration sensors, vibration sensors, force sensors, pressure sensors, thermocouples, Resistance Temperature Detectors (RTD's), pH transmitters, chemical composition and concentration sensors, and the like, may be included with the transponder 50.

The transmitter 54 may transmit or communicate CMP information as a wireless signal 86 representative of the property measured by the sensor 18, or may transmit or communicate other CMP information. In the embodiment of the invention wherein the sensor output 62 is analog, optional processing elements 53, for example, an analog to digital converter signal conditioning element 52 may be used to convert the analog output 62 into a digital output 64 for further processing, storage in memory 58, or transmission by transmitter 54 as detailed below. The transmitted CMP information embedded in wireless signal 86 may thus represent an analog voltage, current, frequency, or resistance, or alternatively a digital signal, for example, a numerical representation of measured data (e.g. a temperature).

The transponder 50 preferably includes a source of electrical power 56, which may be a power supply, a battery, or a remotely-supplied source of electrical power, for example, an LC tank circuit and the like. For example, the remotely-supplied source of electrical power may be a tuned inductive-capacitance (LC) tank circuit as described in U.S. Pat. App. No. 2004/0113790, or a microwave antenna as described in U.S. Pat. No. 7,026,941; the entire disclosure of both references is incorporated herein by reference. The LC tank circuit may operate at a carrier frequency of, for example, 125 KHz, as is common in RFID applications. The microwave antenna may operate at a frequency of, for example, 0.3 to 40 GHz (800 MHz). This feature may obviate the need to provide an on-board power supply to provide electrical power to the transmitter 54, thereby resulting in reduced weight and size, and increased device life.

While the RFID CMP process monitoring system 90 may be capable of operating without an on-board power supply as described above, one of ordinary skill in the art will recognize that the transponder 50 may readily be adapted to operate using a conventional direct current battery (not shown) as a source of electrical power, thereby enhancing signal transmission range. The transponder 50 preferably includes an antenna (not shown in the Figures), for example, a known in the art RFID antenna capable of transmitting or receiving a signal at radio frequencies, or a microwave antenna.

In one embodiment, the remote transceiver 40 may include a remote controller 80, such as a microprocessor or personal computer, and associated memory 82 for storing and processing CMP information received from the plurality of transmitters. The controller 80 may further employ a plurality of operator interfaces (not shown), such as a mouse, keyboard, and monitor, to allow a user of the RFID CMP process monitoring system 90 to access and process the CMP information.

The controller 80 may generate a control response used to alter the CMP process. The control response may include, but is not limited to, altering a CMP pad characteristic (e.g. changing to a new CMP pad, changing a pad operating parameter such as rotational speed or pad pressure, and the like), altering a CMP pad conditioner characteristic (e.g. changing to a new CMP pad conditioner, changing a CMP pad conditioner operating parameter such as rotational speed or pad conditioner pressure, and the like), altering a polishing slurry characteristic (e.g. changing to a new polishing slurry, or altering a chemical characteristic of the slurry such as pH, composition, concentration, and the like), altering a CMP process characteristic (e.g. changing process temperature, signaling a fault condition, removing one or more wafers from the process, and the like), and the like.

FIG. 5 illustrates an exemplary CMP process monitoring system 100 in accordance with additional embodiments of the present invention. The exemplary CMP process is illustrated as a process for polishing a silicon wafer 107, but it will be understood that other materials may be polished using the system of FIG. 5. The illustrated CMP process includes a platen 101, on which a polishing pad 102 is mounted. The platen 101 is rotatably attached to a drive assembly 103 that is configured to rotate the platen 101 at any desired revolution in a range of zero to several hundred revolutions per minute. A polishing head 104 is coupled to a drive assembly 105, which is adapted to rotate the polishing head 104 and to move it radially with respect to the platen 101 as is indicated by 106. Furthermore, the drive assembly 105 may be configured to move the polishing head 104 in any desired manner necessary to load and unload a wafer 107, which is received and held in place by the polishing head 104. A CMP polishing slurry dispenser 108 is provided and positioned such that a polishing slurry 109 may supplied to the polishing pad 102 as required.

In exemplary embodiments illustrated in FIG. 5, the CMP process monitoring system 100 may further include a CMP pad conditioning system 72 including a head 111 attached to which is a CMP pad conditioner 113 including a conditioning surface comprising an abrasive particulate material, such as diamond, having a specified texture designed to obtain an optimum conditioning effect on the polishing pad 102. The CMP pad conditioning system 72 uses the pad conditioner 113 to abrade the surface of the polishing pad 102.

The head 111 may be connected to a drive assembly 112, which, in turn, is configured to rotate the head 111 and/or move it radially with respect to the platen 101 as is indicated by the arrow 114. Moreover, the drive assembly 112 may be configured to provide the head 111 with any motion required for yielding the appropriate conditioning effect. The drive assembly 112 may include at least one motor, typically an electric motor, of any appropriate construction to impart the required functionality to the pad conditioner 113. For instance, the drive assembly 112 may include any type of DC or AC servo motor. Similarly, the drive assemblies 103 and 105 may be equipped with one or more appropriate electric motors.

The CMP process monitoring system 100 includes at least one abrasive article comprising at least one sensor 18 in communication with a transmitter 54. One or both of the sensor 18 and transmitter 54 may be included with the abrasive article, for example, a CMP pad conditioner 113 as shown in FIG. 5, to provide and communicate CMP information as previously described. Preferably, transmitter 54 is electronically coupled to, and included with, RFID transponder 50, as shown in FIG. 4. Transmitter 54 of RFID transponder 50 may transmit or communicate a wireless (e.g. RF) signal 86, including, but not limited to CMP information provided to transmitter 54 by sensor 18, to remote receiver 60, which may be part of a remote transceiver 40 (e.g. a remote RF RFID tag reader/interrogator) as shown in FIG. 4. Optionally, the remote transceiver 40 may include a remote transmitter 70. In some embodiments, the remote transmitter 70 may transmit a wireless (e.g. RF) signal 88, which may include a CMP process control response, to a receiver (not shown) within transponder 50.

In some embodiments, one or more additional sensors (not shown in FIG. 5) may be provided with one or more of polishing pad 102 and/or CMP pad conditioner 113 used in a CMP process. One or more additional sensors (not shown in FIG. 5), for example, force, pressure or seismic transmitters, and the like, may be included as components of the CMP process monitoring system 100. In certain presently preferred embodiments, at least one RFID tag 36 is provided with the polishing pad 102. In some embodiments, a plurality of RFID tags may be provided on or within polishing pad 102, for example, each RFID tag 36 located at pre-determined radial positions around the pad circumference, or at various depths within the pad 102.

Additional RFID tags 36 or transponders 50 (not shown in FIG. 5) may additionally or alternatively be provided with the CMP slurry 109 (e.g. with CMP polishing slurry dispenser 108). The RFID tag 36 may contain encoded polishing pad information, which may be remotely read by remote receiver 60. Although FIG. 5 shows a single remote receiver 60 positioned within the CMP pad conditioning system 72, this is not intended to limit the scope of the invention, as one skilled in the art understands that one or more remote receiver 60 may be positioned virtually anywhere within the CMP process monitoring system 100 that remains in communication (for example, RFID communication) with one or more transmitter 54, transponder 50 and/or RFID tag 36.

The CMP process monitoring system 100 may further include a control unit 80, which is operatively connected to the drive assemblies 103, 105 and 112, and, in one embodiment, may be configured to receive CMP information from the transmitter 54. In one exemplary embodiment not shown in FIG. 5, the control unit 80 includes a remote receiver 60 and a controller 80, as previously described and illustrated in FIG. 4. The control unit 80 may also be connected to the CMP slurry supply dispenser 108 to dispense CMP slurry 109.

The control unit 80 may include additional sub units that may communicate with appropriate communications networks, such as cable connections, wireless networks and the like. For instance, the control unit 80 may include a sub control unit as is provided in conventional CMP systems to appropriately provide control signals 121, 122 and 123 to the drive assemblies 105, 103 and 112, respectively, to coordinate the movement of the polishing head 104, the polishing pad 102 and the pad conditioner 113. The control signals 121, 122 and 123 may represent any suitable signal form, including electrically and optically transmitted signal forms, to instruct the corresponding drive assemblies to operate at the required rotational and/or translational speeds.

In one embodiment, the control unit 80 may be configured to receive CMP information transmitted to a remote reader 60 by transmitter 54 of RFID transponder 50, which may include a sensor 18. The CMP information may include measured CMP process data communicated to the transmitter 54 by the sensor 18, stored CMP pad data, stored CMP pad conditioner data, and the like. The CMP information may be wirelessly transmitted as wireless signal 86 using a wireless system such as, for example, the previously described RFID system, or may be transmitted using wired electrical or optical transmission signal 131 as shown in FIG. 5. In particular embodiments, the control unit 80 may further be configured to receive and process at least one additional transmitter signal 124 from the CMP pad conditioning system 72 during operation. Transmitter signal 124 may include force, pressure, or seismic information transmitted from one or more additional transmitters 130 within the CMP pad conditioning system 72.

The ability to receive and process the transmitter signal 131 may be implemented in the form of a corresponding sub unit, a separate control device, such as a personal computer (PC), programmable logic controller (PLC), and the like, or as part of a facility management system. Data communication to combine the conventional process control functions with the transmitter signal processing may be obtained by the above communications networks. It will be understood by one skilled in the art that signals shown in FIG. 5 by double-ended arrows indicate that, optionally, the signals may be transmitted or communicated in both directions.

During the operation of the CMP process monitoring system 100, the wafer 107 may be loaded onto the polishing head 104, which may have been appropriately positioned to receive the wafer 107 and convey it to the polishing pad 102. It should be noted that the polishing head 104 typically comprises a plurality of gas lines supplying vacuum and/or gases to the polishing head 104 to fix the wafer 107 and to provide a specified hold-down force during the relative motion between the wafer 107 and the polishing pad 102.

The various functions required for properly operating the polishing head 104 may also be controlled by the control unit 80. The slurry supply 108 may be actuated, for example, by the control unit 80, to supply the slurry 109 that is distributed across the polishing pad 102 upon rotating the platen 101 and the polishing head 104. The control signals 121 and 122 supplied to the drive assemblies 105 and 103, respectively, may effect a specified relative motion between the wafer 107 and the polishing pad 102 to achieve a desired removal rate, which depends on the characteristics of the wafer 107, the construction and current status of the polishing pad 102, the type of slurry 109 used, the down force applied to the wafer 107, and the like.

Prior to and/or during the polishing of the wafer 107, the CMP pad conditioner 113 may be brought into contact with the polishing pad 102 to rework the surface of the polishing pad 102. To this end, the head 111 may be rotated and/or swept across the polishing pad 102, wherein, for example, the control unit 80 provides the control signal 123 such that a substantially constant speed, for example, a rotational speed, is maintained during the conditioning process. Depending on the status of the polishing pad 102 and the conditioning surface of the member 113, for a given type of slurry 109, a frictional force acts and requires a specific amount of motor torque to maintain the specified constant rotational speed.

In one exemplary use of a CMP pad conditioning system 72, a CMP pad 102, which may include an optional RFID tag 36, is positioned proximate at least one sensor 18 provided with the CMP pad conditioner 113, thereby providing CMP information to a transmitter 54 provided with the pad conditioner 113. The CMP information is transmitted by transmitter 54 to a remote receiver 60, and communicated to a controller, e.g. control unit 80. Transmission of CMP information from the transmitter 54 to the remote receiver 60 may be achieved by electrical or optical transmission, or as shown in FIG. 5, wirelessly by transmitting the CMP information from RFID transponder 50 to reader interrogator 60 as wireless signal 86. CMP information may be further transmitted wirelessly from remote receiver 60 to control unit 80, or by electrical or optical transmission as indicated by transmitter signal 131.

The control unit 80 may generate a control response and transmit a response used to alter the CMP process via control signals 121, 122, 123. Control signals 121, 122, 123 may be wirelessly transmitted using, for example, a RFID system as described herein, or may be wire-transmitted by electrical or optical cable. The control response may include, but is not limited to, altering a CMP pad characteristic (e.g. changing to a new CMP pad, changing a pad operating parameter such as rotational speed or pad pressure, and the like), altering a CMP pad conditioner characteristic (e.g. changing to a new CMP pad conditioner, changing a CMP pad conditioner operating parameter such as rotational speed or pad conditioner pressure, and the like), altering a polishing slurry characteristic (e.g. changing to a new polishing slurry, or altering a chemical characteristic of the slurry such as pH, composition, concentration, and the like), altering a CMP process characteristic (e.g. changing process temperature, signaling a fault condition, removing one or more wafers from the process).

In another exemplary embodiment, an inductive sensor in the conditioning arm of a CMP machine could also be used to calibrate the apparatus that controls the force applied to the conditioner. When the conditioner in not in use, it is normally placed in a parking location that is out of the way when pads are changed. The parking location could include a spring with a known force constant that the conditioner could compress when in the parking location. The inductive sensor could be used to measure the force constant of the spring by monitoring the height of the conditioner above a conductive metallic surface at two different force levels. If the force is controlled by air pressure, for example, the change in air pressure could be calibrated to a change in force as a function of pressure.

It is apparent to those skilled in the art from the above description that various modifications can be made without departing from the scope and principles of this invention, and it should be understood that this invention is not to be unduly limited to the illustrative embodiments set forth hereinabove. All publications and patents referenced herein are incorporated by reference to the same extent as if each individual publication or patent was specifically and individually indicated to be incorporated by reference. Various embodiments of the invention have been described. These and other embodiments are within the scope of the following claims.

We claim:

1. An abrasive article, comprising:
    a substrate having opposite major surfaces;
    an abrasive material overlaying at least a portion of at least one of the major surfaces of the substrate to form a surface of an abrasive article, wherein said abrasive material comprises abrasive particles embedded in a matrix material comprising a metal and affixed to the substrate by the matrix material;
    a sensor for providing chemical-mechanical polishing (CMP) information positioned within the substrate; and
    a transmitter in wireless communication with the sensor and positioned within the substrate proximate the sensor, wherein the transmitter is adapted to wirelessly transmit the CMP information provided by the sensor to a receiver remote from the abrasive article.

2. The abrasive article of claim 1, further comprising a RFID tag.

3. The abrasive article of claim 1, wherein the sensor is selected from one or more of the group consisting of a thickness sensor, a velocity sensor, an acceleration sensor, a vibration sensor, a force sensor, a pressure sensor, a temperature sensor, a pH sensor, a chemical composition sensor, and a chemical concentration sensor.

4. The abrasive article of claim 3, wherein the sensor is an eddy current thickness sensor adapted to measure a CMP pad thickness.

5. The abrasive article of claim 1, wherein the transmitter is a component in a transponder for a RFID system, and wherein the remote receiver is a reader for the RFID system.

6. The abrasive article of claim 5, wherein one or both of the transponder and the reader further comprises one or more of the group consisting of a demodulator circuit, a resonator circuit, a transmitter, a receiver, a processor, a controller, a memory, an analog to digital converter, a digital to analog converter, an antenna, and a power source.

7. The abrasive article of claim 1, wherein the CMP information is selected from one or more of CMP pad conditioner data, CMP pad data, and measured CMP process data including one or more of a velocity, acceleration, force, pressure, vibration, thickness, temperature, pH, chemical composition, and chemical concentration measured in a CMP process.

8. The abrasive article of claim 7, wherein at least one of the CMP pad conditioner data and the CMP pad data is selected from the group consisting of manufacturing data, composition data, tracking data, quality data, and history data.

9. The abrasive article of claim 1, further comprising a mounting port provided in at least one of the major surfaces.

10. The abrasive article of claim 9, wherein the mounting port includes an orifice extending between both major surfaces.

11. The abrasive article of claim 9, further comprising a bearing proximate the mounting port, wherein the bearing is adapted to permit rotation of a pad conditioner about the transmitter.

12. A chemical-mechanical polishing (CMP) process monitoring system, comprising:
    at least one abrasive article including a substrate having opposite major surfaces and an abrasive material overlaying at least a portion of at least one of the major surfaces, wherein said abrasive material comprises abrasive particles embedded in a matrix material comprising a metal and affixed to the substrate by the matrix material;
    at least one sensor positioned within the substrate proximate the at least one major surface, wherein each sensor is adapted to determine CMP information;
    a transmitter in wireless communication with the sensor and positioned within the substrate in wireless communication range of the sensor, wherein the transmitter is adapted to wirelessly transmit at least a portion of the CMP information; and
    at least one receiver remote from the abrasive article and adapted to receive the wirelessly transmitted CMP information.

13. The system of claim 12, wherein the CMP information is selected from at least one of CMP pad conditioner data, CMP pad data, and measured CMP process data.

14. The system of claim 13, wherein at least one of the CMP pad conditioner data and the CMP pad data are selected from the group consisting of manufacturing data, composition data, tracking data, quality data, and history data.

15. The system of claim 12, further comprising a controller adapted to process the CMP information and provide a control response selected from the group consisting of altering a CMP pad characteristic, altering a CMP pad conditioner characteristic, altering a CMP polishing slurry characteristic, and altering a CMP process characteristic.

16. The system of claim 12, wherein the sensor, the transmitter, and the receiver comprise a radio frequency identification system.

17. The system of claim 16, wherein the radio frequency identification system further comprises at least one of a RFID tag, a modulator circuit, a demodulator circuit, a resonator circuit, an analog to digital converter, a digital to analog converter, a memory, a controller, an antenna, and a power source.

18. The system of claim 12, wherein each sensor is selected from the group consisting of a thickness sensor, a velocity sensor, an acceleration sensor, a vibration sensor, a force sensor, a pressure sensor, a temperature sensor, a pH sensor, a chemical composition sensor, a chemical concentration sensor, and a RFID tag reader.

* * * * *